(12) United States Patent
Huang et al.

(10) Patent No.: US 12,199,190 B2
(45) Date of Patent: Jan. 14, 2025

(54) SILICON CHANNEL TEMPERING

(71) Applicant: Taiwan Semiconductor Manufacturing Co., Ltd., Hsinchu (TW)

(72) Inventors: Mao-Lin Huang, Hsinchu (TW); Jia-Ni Yu, New Taipei (TW); Lung-Kun Chu, New Taipei (TW); Chung-Wei Hsu, Hsinchu (TW); Chih-Hao Wang, Hsinchu (TW); Kuo-Cheng Chiang, Hsinchu County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 31 days.

(21) Appl. No.: 18/328,946

(22) Filed: Jun. 5, 2023

(65) Prior Publication Data

US 2023/0307552 A1    Sep. 28, 2023

Related U.S. Application Data

(62) Division of application No. 17/097,323, filed on Nov. 13, 2020, now Pat. No. 11,670,723.

(Continued)

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02236* (2013.01); *H01L 21/02532* (2013.01); *H01L 21/02603* (2013.01); *H01L 21/0262* (2013.01); *H01L 21/28185* (2013.01); *H01L 21/823807* (2013.01); *H01L 27/092* (2013.01);
(Continued)

(58) Field of Classification Search
CPC ......... H01L 21/02532; H01L 21/02603; H01L 29/0673; H01L 29/42392; H01L 29/78696
See application file for complete search history.

(56) References Cited

U.S. PATENT DOCUMENTS 9,818,872 B2    11/2017    Ching
9,887,269 B2    2/2018    Ching
(Continued)

FOREIGN PATENT DOCUMENTS

CN    109427900 A    3/2019
KR    20150033496 A    4/2015
(Continued)

*Primary Examiner* — Brian Turner
(74) *Attorney, Agent, or Firm* — HAYNES AND BOONE, LLP

(57) ABSTRACT

A semiconductor device according to the present disclosure includes a fin structure over a substrate, a vertical stack of silicon nanostructures disposed over the fin structure, an isolation structure disposed around the fin structure, a germanium-containing interfacial layer wrapping around each of the vertical stack of silicon nanostructures, a gate dielectric layer wrapping around the germanium-containing interfacial layer, and a gate electrode layer wrapping around the gate dielectric layer.

20 Claims, 24 Drawing Sheets

Related U.S. Application Data

(60) Provisional application No. 63/023,578, filed on May 12, 2020.

(51) Int. Cl.
    *H01L 21/28*     (2006.01)
    *H01L 21/8238*     (2006.01)
    *H01L 27/092*     (2006.01)
    *H01L 29/06*     (2006.01)
    *H01L 29/423*     (2006.01)
    *H01L 29/66*     (2006.01)

(52) U.S. Cl.
    CPC ...... *H01L 29/0653* (2013.01); *H01L 29/0673* (2013.01); *H01L 29/42392* (2013.01); *H01L 29/66545* (2013.01); *H01L 29/66636* (2013.01); *H01L 29/66742* (2013.01); *H01L 29/78618* (2013.01); *H01L 29/78684* (2013.01)

(56) References Cited

U.S. PATENT DOCUMENTS

| | | | |
|---|---|---|---|
| 9,899,398 | B1 | 2/2018 | Colinge |
| 10,032,627 | B2 | 7/2018 | Lee |
| 10,109,721 | B2 | 10/2018 | Lin |
| 10,157,799 | B2 | 12/2018 | Ching |
| 10,199,502 | B2 | 2/2019 | Huang |
| 10,290,546 | B2 | 5/2019 | Chiang |
| 10,475,902 | B2 | 11/2019 | Lee |
| 2011/0147697 | A1* | 6/2011 | Shah ............... H01L 29/775 977/762 |
| 2015/0084041 | A1 | 3/2015 | Hur |
| 2015/0115216 | A1 | 4/2015 | Glass |
| 2016/0351701 | A1 | 12/2016 | Cea |
| 2017/0154973 | A1 | 6/2017 | Ching |
| 2018/0069006 | A1 | 3/2018 | Kim |
| 2018/0175036 | A1 | 6/2018 | Ching |
| 2019/0067125 | A1 | 2/2019 | Chiang |
| 2019/0097023 | A1 | 3/2019 | Wu |
| 2019/0280107 | A1 | 9/2019 | Ando |
| 2020/0312844 | A1 | 10/2020 | Jeon |
| 2020/0395482 | A1 | 12/2020 | Song |
| 2021/0296506 | A1* | 9/2021 | Wei ............... H01L 29/785 |

FOREIGN PATENT DOCUMENTS

| | | |
|---|---|---|
| KR | 20190024600 A | 3/2019 |
| TW | 201947668 A | 12/2019 |

* cited by examiner

SILICON CHANNEL TEMPERING

PRIORITY DATA

This application is a divisional application of U.S. patent application Ser. No. 17/097,323, filed Nov. 13, 2020, which claims priority to U.S. Provisional Patent Application No. 63/023,578 filed on May 12, 2020, entitled "SILICON CHANNEL TEMPERING" each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Several methods have been proposed to achieve desirable threshold voltages of p-type field effect transistor (PFETs). In one technology, more than one p-type work function metal layers may be stacked over silicon channels to obtain desired threshold voltages. In another technology, silicon channels in p-type devices are replaced with silicon germanium channels. However, these methods have met with different challenges. For the former, it is challenging to identify p-type work function metals to achieve the satisfactory band gap. For the latter, integration of silicon germanium channels has proved challenging. Therefore, although conventional technologies for forming p-type MBC devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
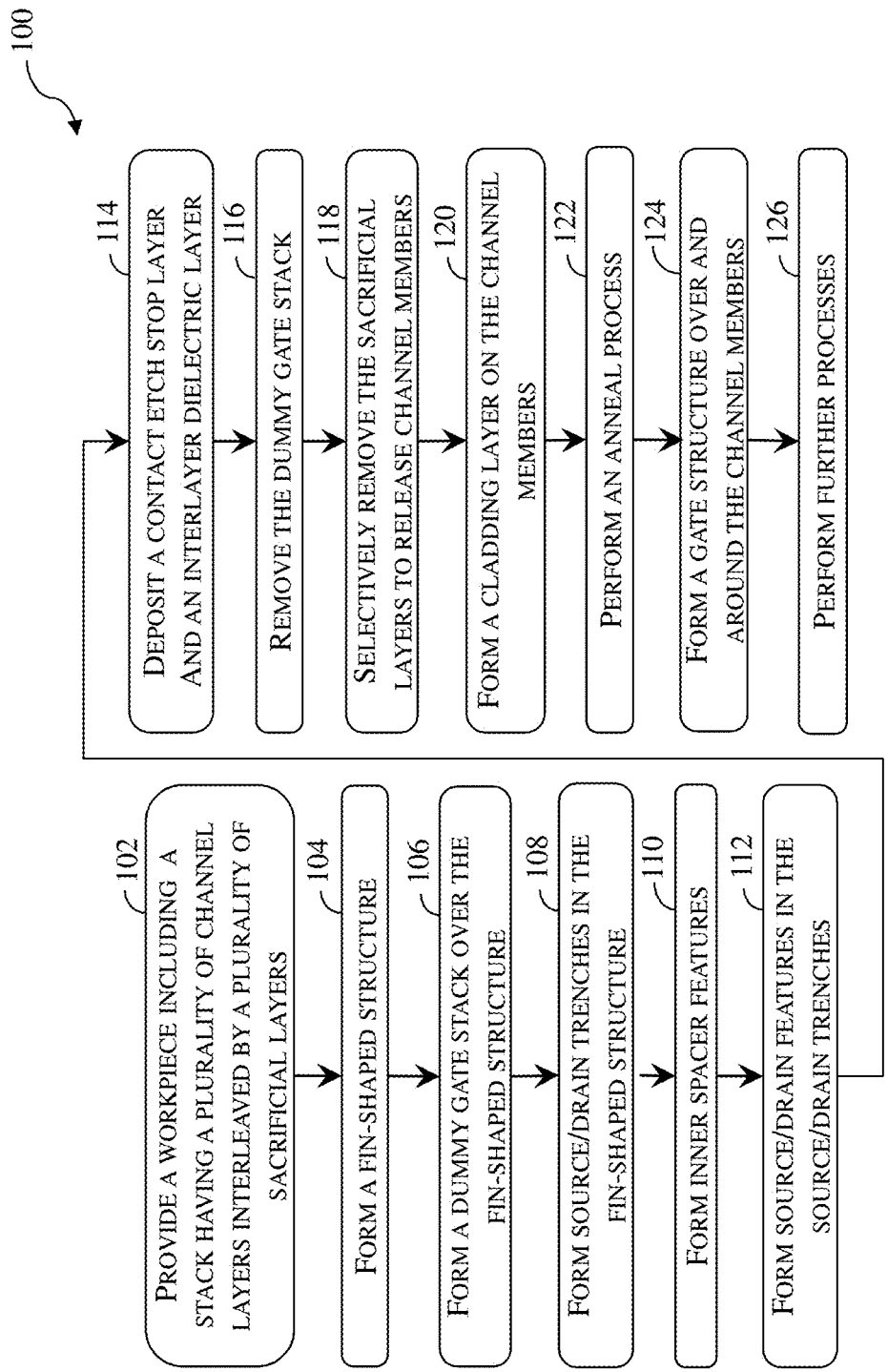
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to interfacial layers that introduce dipoles or fixed charges.

MBC transistors can be either n-type or p-type. As different types of MBC transistors require different threshold voltages, several methods of threshold voltage modulation have been proposed. For example, different work function metal stacks may be implemented in gate structures for n-type and p-type MBC transistors. Additionally, when the channel member is formed of silicon, a search for a satisfactory p-type work function metal is still ongoing. For another example, different channel materials are implemented in different device regions. The former method requires stacking of several work function metal layers around and between tightly spaced channel members. The latter involves integration of fabrication processes for channel members of different semiconductor compositions. In both of these example methods, the process window may be small, the performance may be less than ideal, and the fabrication cost may be high.

The present disclosure provides embodiment methods for forming a semiconductor device that includes a silicon channel and a germanium cladding layer disposed on the silicon channel. In an example embodiment, after channel members in a channel region are released, a germanium-containing cladding layer is deposited on surfaces of the channel members. A first anneal process is performed to drive in the germanium in the germanium-containing cladding layer. As a result, at least a portion of the germanium-containing cladding in converted into a silicon germanium layer. The annealed cladding layer is then subject to a pre-clean process. The pre-clean process removes the germanium-rich portion of the cladding layer and oxides the silicon-rich portion of the cladding layer to form a germanium-containing interfacial layer. A gate dielectric layer is then deposited over the germanium-containing interfacial layer. A second anneal process may be performed after the deposition of the gate dielectric layer. It is observed that when implemented in a p-type device region, the germanium-containing interfacial layer may provide dipoles or fixed charges that lead to low threshold voltage for p-type MBC transistors. In other words, the silicon channel members in a p-type device region may be "tempered" to provide desirable threshold voltage.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-21, which are fragmentary perspective views or cross-sectional views of the workpiece at different stages of fabrication according to embodiments of method 100.

Figure 2:
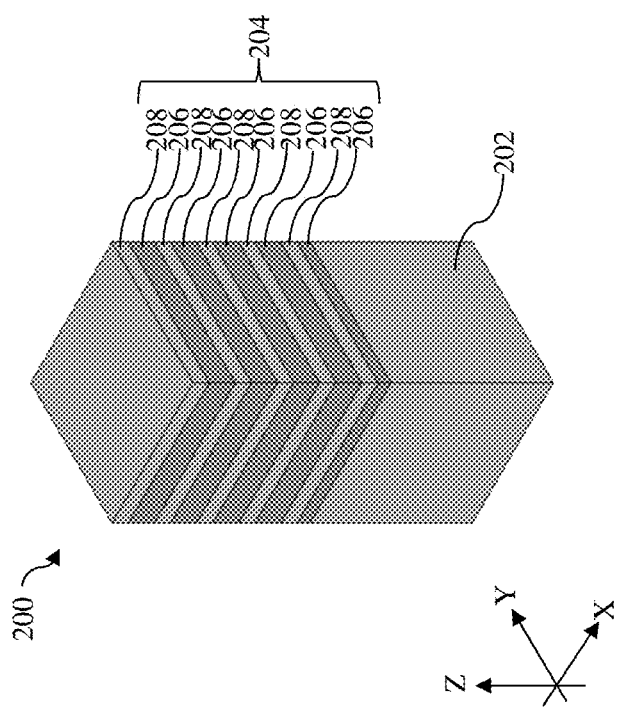
FIGS. 2-21 illustrate fragmentary perspective view or cross-sectional views of a workpiece during a fabrication process according to the method of FIG. 1, according to one or more aspects of the present disclosure.

Referring to FIGS. 1 and 2, method 100 includes a block 102 where a workpiece 200 is provided. It is noted that because the workpiece 200 will be fabricated into a semiconductor device, the workpiece 200 may also be referred to as the semiconductor device 200 as the context requires. The workpiece 200 may include a substrate 202. Although not explicitly shown in the figures, the substrate 202 may include an n-type well region and a p-type well region for fabrication of transistors of different conductivity types. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202. For avoidance of doubts, the X direction, the Y direction and the Z direction are perpendicular to one another.

As shown in FIG. 2, the workpiece 200 also includes a stack 204 disposed over the substrate 202. The stack 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 are epitaxy layers and may be deposited using an epitaxy process. Suitable epitaxy processes include vapor-phase epitaxy (VPE), ultra-high vacuum chemical vapor deposition (UHV-CVD), molecular beam epitaxy (MBE), and/or other suitable processes. As shown in FIG. 2, the sacrificial layers 206 and the channel layers 208 are deposited alternatingly, one-after-another, to form the stack 204. It is noted that five (5) layers of the sacrificial layers 206 and five (5) layers of the channel layers 208 are alternately and vertically arranged as illustrated in FIG. 2, which is for illustrative purposes only and not intended to be limiting beyond what is specifically recited in the claims. It can be appreciated that any number of sacrificial layers 206 and channel layers 208 can be formed in the stack 204. The number of layers depends on the desired number of channels members for the device 200. In some embodiments, the number of the channel layers 208 is between 2 and 10.

Figure 3:
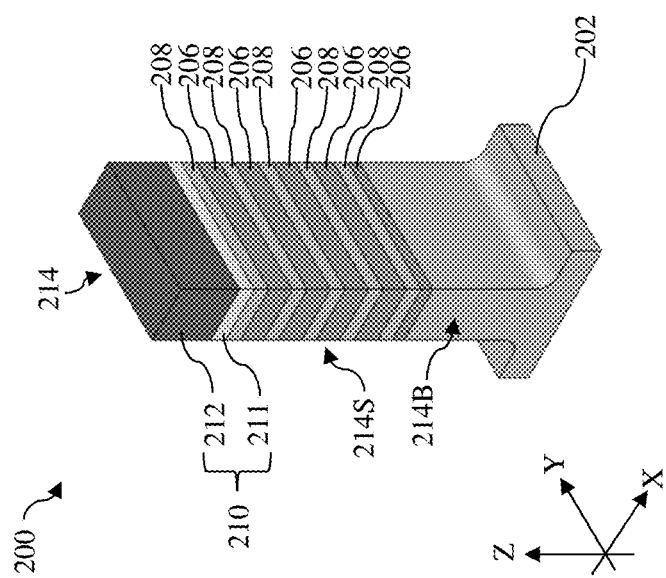

Referring to FIGS. 1 and 3, method 100 includes a block 104 where a fin-shaped structure 214 is formed from the stack 204. In some embodiments, the stack 204 and a portion of the substrate 202 are patterned to form the fin-shaped structure 214. For patterning purposes, a hard mask layer 210 may be deposited over the stack 204. The hard mask layer 210 may be a single layer or a multilayer. In one example, the hard mask layer 210 includes a silicon oxide layer 211 and a silicon nitride layer 212 over the silicon oxide layer 211. As shown in FIG. 3, the fin-shaped structure 214 extends vertically along the Z direction from the substrate 202 and extends lengthwise along the Y direction. The fin-shaped structure 214 includes a base portion 214B formed from the substrate 202 and a stack portion 214S formed from the stack 204. The fin-shaped structure 214 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 214 by etching the stack 204 and the substrate 202. The etching process can include dry etching, wet etching, reactive ion etching (RIE), and/or other suitable processes.

Figure 4:
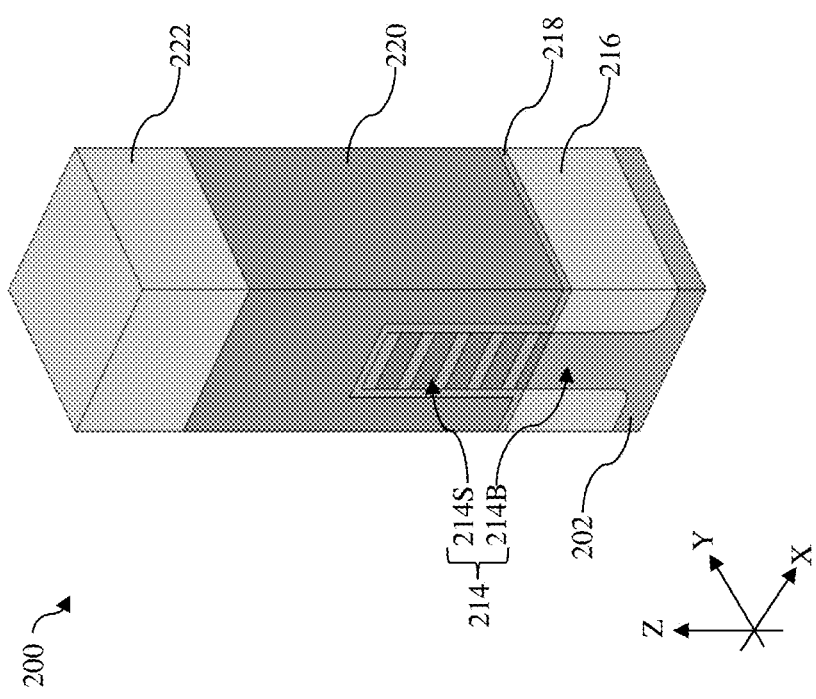

Referring to FIGS. 1, 4, 5, and 6, method 100 includes a block 106 where a dummy gate stack 224 is formed over the fin-shaped structure 214. In some embodiments represented in FIG. 4, after operations at block 104, an isolation feature 216 may be formed adjacent and around the base portion 214B of the fin-shaped structure 214. The isolation feature 216 is disposed between the fin-shaped structure 214 and another fin-shaped structure 214 (not shown). The isolation feature 216 may also be referred to as a shallow trench isolation (STI) feature 216. In an example process, a dielectric layer is first deposited over the workpiece 200, filling the trenches between the fin-shaped structure 214 and a neighboring fin-shaped structure 214 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an atomic layer deposition (ALD) process, a physical vapor deposition (PVD) process, spin-on coating, and/or other suitable process. The deposited dielectric material is then thinned and planarized, for example by a chemical mechanical polishing (CMP) process. The planarized dielectric layer is further recessed by a dry etching process, a wet etching process, and/or a combination thereof to form the isolation feature 216. As shown in FIG. 4, the stack portion 214S of the fin-shaped structure 214 rises above the isolation feature 216. As shown in FIG. 4, the hard mask layer 210 may also be removed during the formation of the isolation feature 216.

Figure 5:
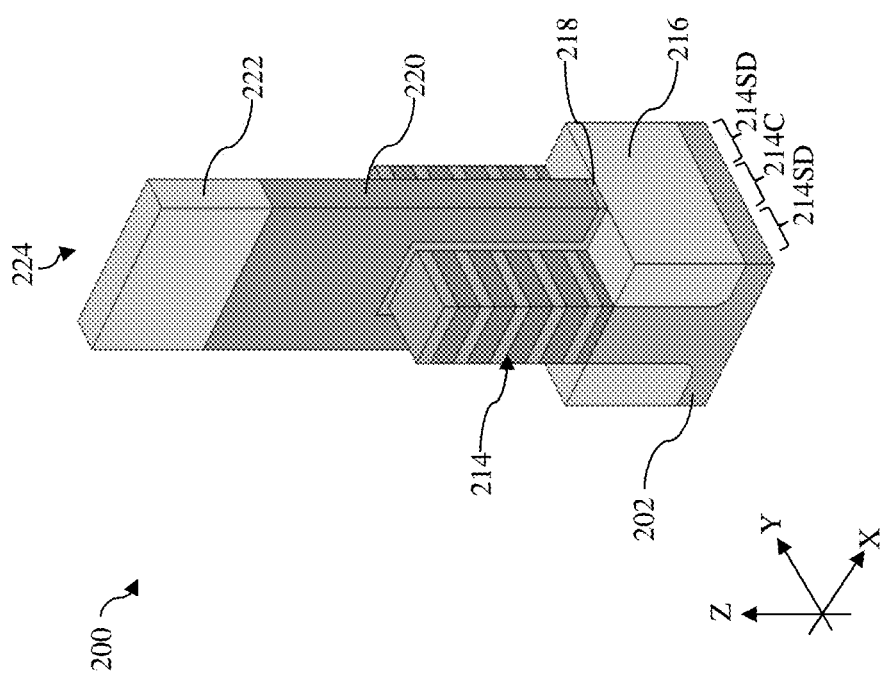

In some embodiments, a gate replacement process (or gate-last process) is adopted where the dummy gate stack 224 (shown in FIG. 5) serves as placeholders for a functional gate structure. Other processes and configuration are possible. To form the dummy gate stack 224, a dummy dielectric layer 218, a dummy gate electrode layer 220, and a gate-top hard mask layer 222 are deposited over the workpiece 200, as shown in FIG. 4. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 218 may include silicon oxide, the dummy gate electrode layer 220 may include polysilicon, and the gate-top hard mask layer 222 may be a multi-layer that includes silicon oxide and silicon nitride. Using photolithography and etching processes, the gate-top hard mask layer 222 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask 222 as the etch mask, the dummy dielectric layer 218 and the dummy gate electrode layer 220 are then etched to form the dummy gate stack 224. As shown in FIG. 5, the dummy gate stack 224 is formed over the isolation feature 216 and is at least partially disposed over the fin-shaped structures 214. As shown in FIG. 5, the dummy gate stack 224 extends lengthwise along the X direction to wrap over the fin-shaped structure 214. The portion of the fin-shaped structure 214 underlying the dummy gate stack 224 is a channel region 214C. The channel region 214C and the dummy gate stack 224 also define source/drain regions 214SD that are not vertically overlapped by the dummy gate stack 224. The channel region 214C is disposed between two source/drain regions 214SD.

Figure 6:
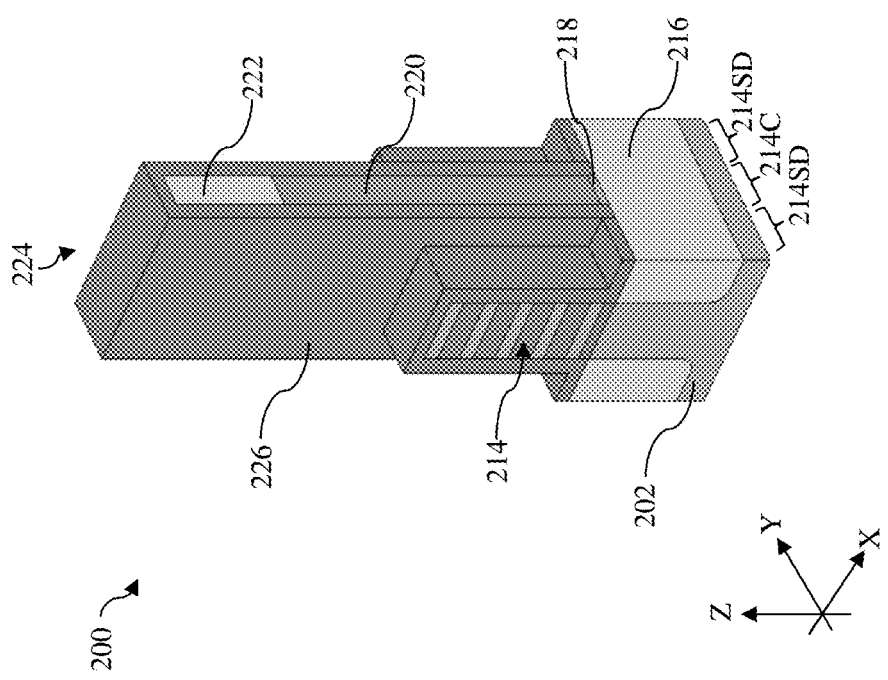

Referring to FIG. 6, operations at block 106 may include formation of a gate spacer layer 226 over the top surface and sidewalls of the dummy gate stack 224. In some embodiments, the formation of the gate spacer layer 226 includes conformal deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

Figure 7:
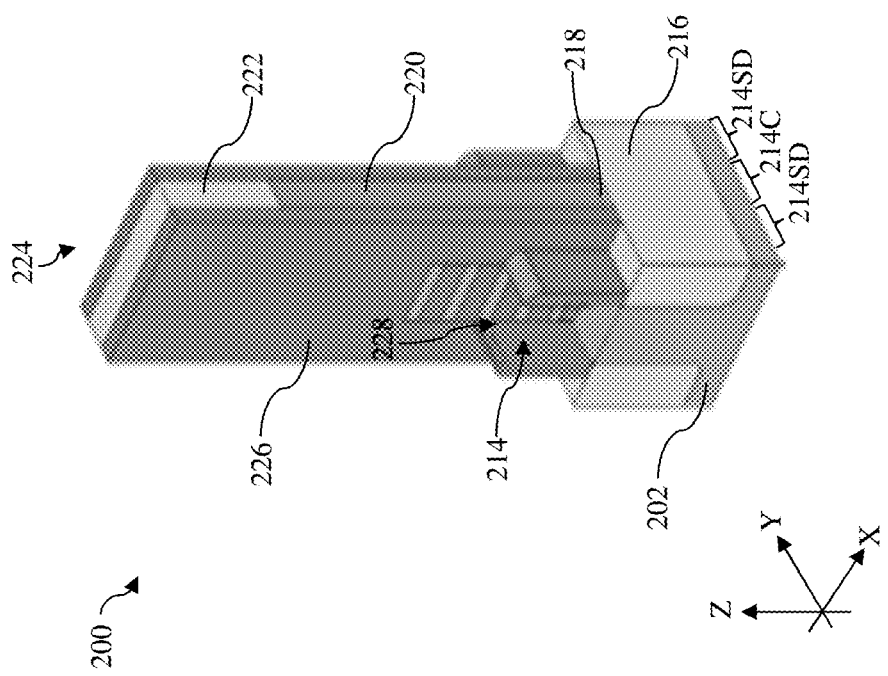

Referring to FIGS. 1 and 7, method 100 includes a block 108 where source/drain trenches 228 are formed in the fin-shaped structure 214. In embodiments represented in FIG. 7, after the deposition of the gate spacer layer 226, the workpiece 200 is etched in an etch process. As shown in FIG. 7, the etch process removes the gate spacer layer 226 on top-facing surfaces of the gate-top hard mask layer 222 and recesses the source/drain regions 214SD of the fin-shaped structure 214, which are not masked by the gate top hard mask layer 222 and the gate spacer layer 226. The recess of the source/drain regions 214SD results in the source/drain trenches 228 defined by gate spacer layer 226. The etch process at block 108 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 7, sidewalls of the sacrificial layers 206 and the channel layers 208 in the channel region 214C are exposed in the source/drain trenches 228.

Figure 8:
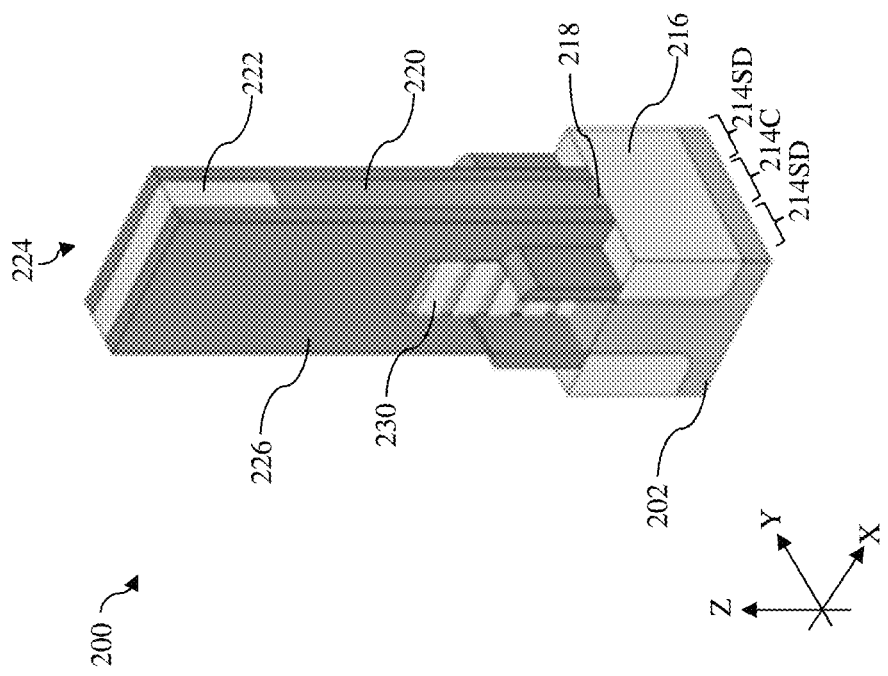

Referring to FIGS. 1 and 8, method 100 includes a block 110 where inner spacer features 230 are formed. At block 110, the sacrificial layers 206 exposed in the source/drain trenches 228 are selectively and partially recessed to form inner spacer recesses, while the exposed channel layers 208 are moderately etched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone (O3). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or NH$_4$OH etchant. After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacer layer 226 and sidewalls of the channel layers 208, thereby forming the inner spacer features 230 as shown in FIG. 8. In some embodiments, the etch back process at block 110 may be a dry etch process that includes use of an oxygen-containing gas, hydrogen, nitrogen, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBR$_3$), an iodine-containing gas (e.g., CF$_3$I), other suitable gases and/or plasmas, and/or combinations thereof.

Figure 9:
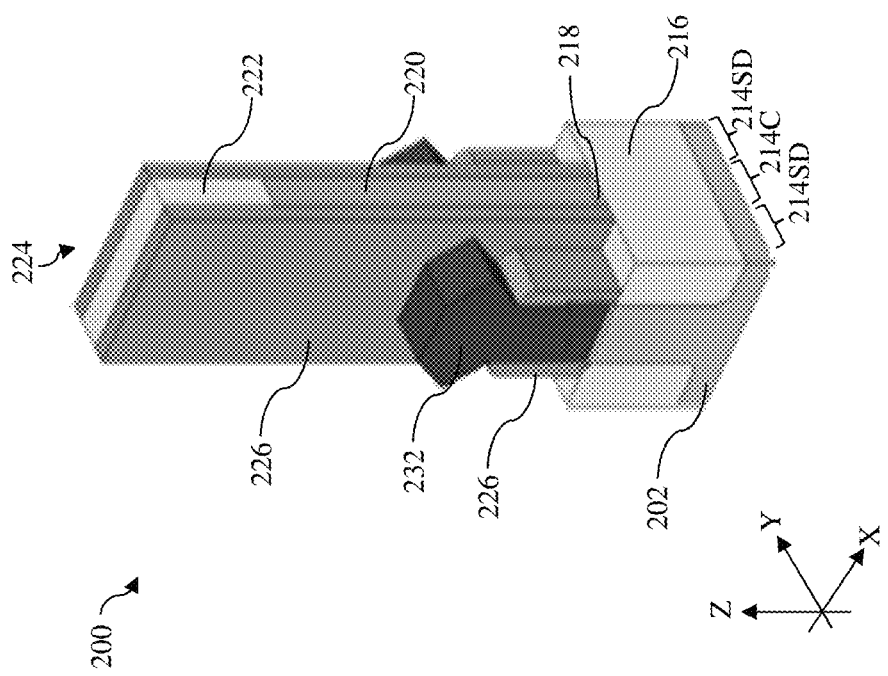

Referring to FIGS. 1 and 9, method 100 includes a block 112 where source/drain features 232 are formed in the source/drain trenches 228 (shown in FIG. 8) over the source/drain regions 214SD. In some embodiments, the source/drain features 232 may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. The source/drain features 232 is therefore coupled to the channel layers 208 or the released channel members 2080 (to be described below). Depending on the conductivity type of the to-be-formed MBC transistor, the source/drain features 232 may be n-type source/drain features or p-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). Example p-type source/drain features may include Si, Ge, AlGaAs, SiGe, boron-doped SiGe, or other suitable material and may be in-situ doped during the epitaxial process by introducing a p-type dopant, such as boron (B), or ex-situ doped using an implantation process (i.e., a junction implant process). In the depicted embodiment, the source/drain features 232 are p-type source/drain features and include boron-doped silicon germanium (SiGe).

Figure 10:
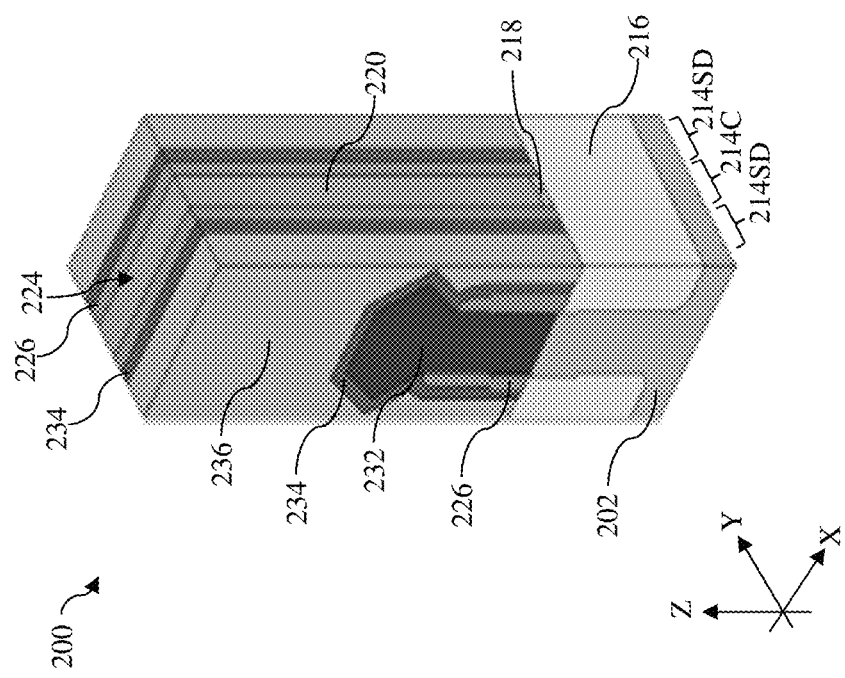
Figure 11:
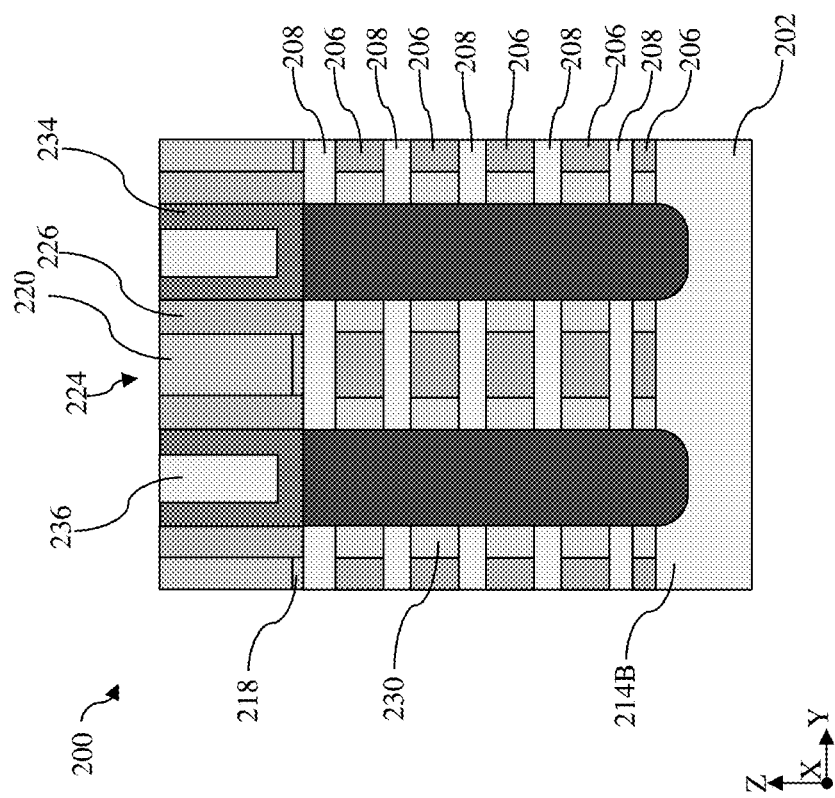

Referring to FIGS. 1, 10 and 11, method 100 includes a block 114 where a contact etch stop layer (CESL) 234 and an interlayer dielectric (ILD) layer 236 are deposited over the workpiece 200. FIG. 10 illustrates a fragmentary perspective view of the workpiece 200 showing the relative position of the CESL 234 with respect to the source/drain feature 232, the gate spacer layer 226. FIG. 11 illustrates a fragmentary cross-sectional view of the workpiece 200 along X direction, along which the dummy gate stack 224 extends lengthwise. The CESL 234 may include silicon nitride, silicon oxide, silicon oxynitride, and/or other materials known in the art and may be formed by ALD, plasma-enhanced chemical vapor deposition (PECVD) process and/or other suitable deposition or oxidation processes. As shown in FIGS. 10 and 11, the CESL 234 may be deposited on top surfaces of the source/drain features 232 and along sidewalls of the gate spacer layer 226. Although the CESL 234 is also deposited over the top surface of the gate spacer layer 226 and the gate top hard mask layer 222, FIGS. 10 and 11 only illustrate perspective and cross-sectional views of the workpiece 200 after the gate top hard mask layer 222 is removed by a planarization process (to be described below).

Block 114 also includes depositing of the ILD layer 236 over the CESL 234. In some embodiments, the ILD layer 236 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 236 may be deposited by a PECVD process or other suitable deposition technique. In some embodiments, after formation of the ILD layer 236, the workpiece 200 may be annealed to improve integrity of the ILD layer 236. To remove excess materials and to expose top surfaces of the dummy gate stacks 224, a planarization process, such a chemical mechanical polishing (CMP) process may be performed, as illustrated in FIGS. 10 and 11. The gate top hard mask layer 222 is also removed by the planarization process.

Figure 12:
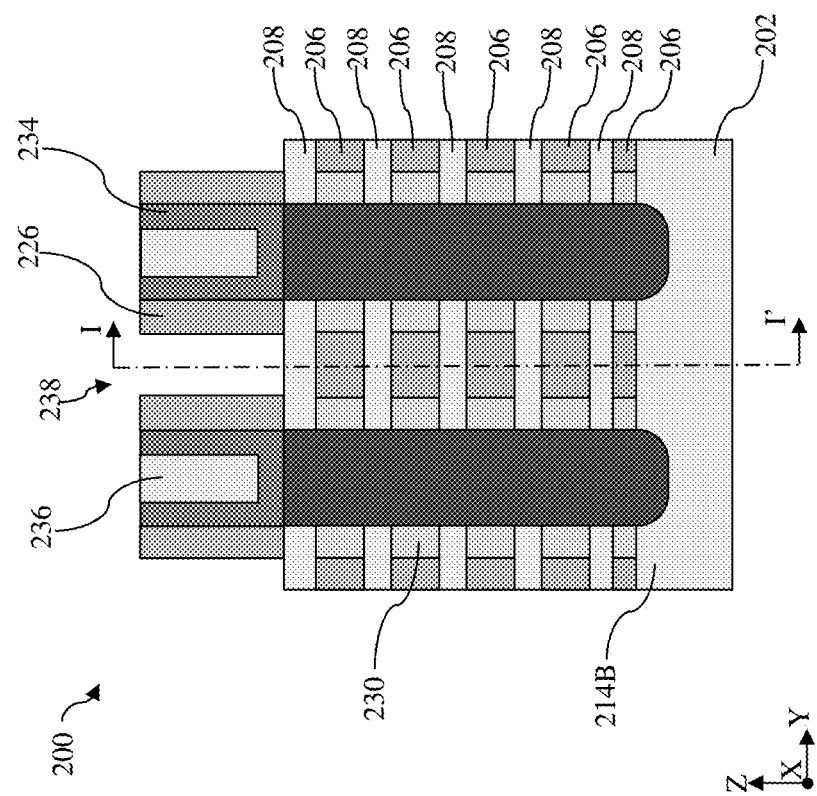
Figure 13:
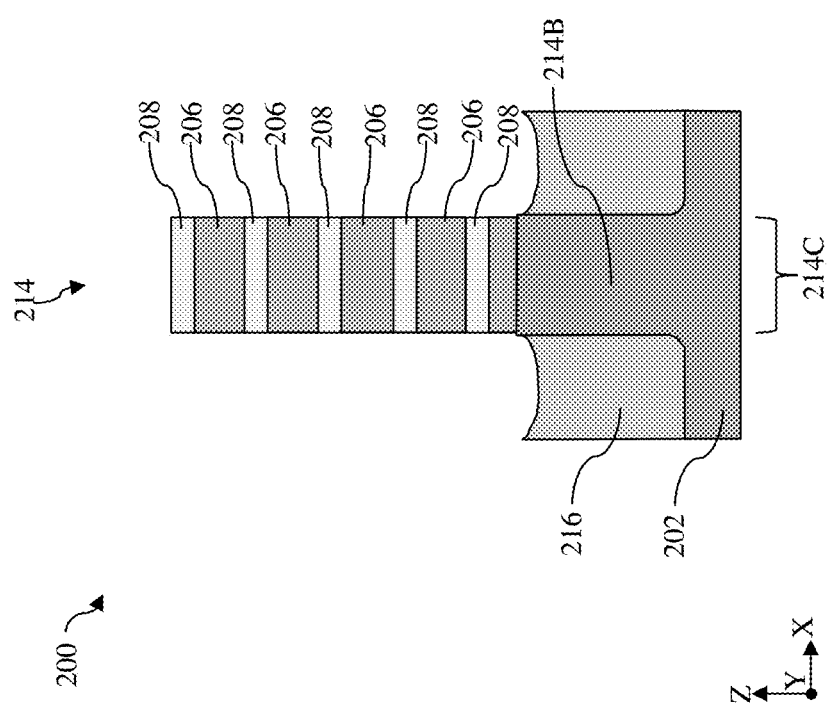

Referring to FIGS. 1, 12 and 13, method 100 includes a block 116 where the dummy gate stack 224 is removed. Referring to FIG. 12, the removal of the dummy gate stack 224 results in a gate trench 238 over the channel regions 214C. A gate structure 250 (to be described below) is to be formed in the gate trench 238, as will be described below. The removal of the dummy gate stack 224 may include one or more etching processes that are selective to the material in the dummy gate stack 224. For example, the removal of the dummy gate stack 224 may be performed using as a selective wet etch, a selective dry etch, or a combination thereof. FIG. 13 illustrates a fragmentary cross-sectional view that coincide with the section I-I' in FIG. 12. FIG. 13 therefore illustrates a cross-sectional view along the Y direction, which is the lengthwise direction of the fin-shaped structure 214. As shown in FIG. 13, after the removal of the dummy gate stack 224, sidewalls of the channel layers 208 and sacrificial layers 206 in the channel regions 214C are exposed in the gate trench 238.

Figure 14:
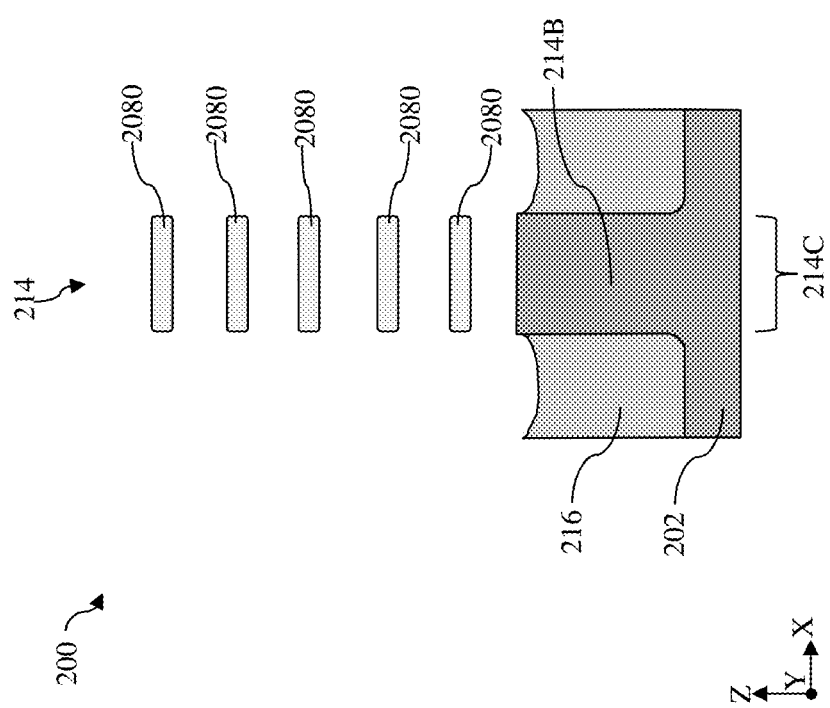

Referring to FIGS. 1 and 14, method 100 includes a block 118 where the sacrificial layers 206 in the channel region 214C are selectively removed to release the channel members 2080. After the removal of the dummy gate stack 224, block 118 of method 100 may include operations to selectively remove the sacrificial layers 206 between the channel layers 208 in the channel regions 214C. The selective removal of the sacrificial layers 206 releases the channel layers 208 to form channel members 2080. Here, because the dimensions of the channel members 2080 are less than 100 nm, the channel members 2080 may also be referred to as nanostructures. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as NH$_4$OH.

Figure 15:
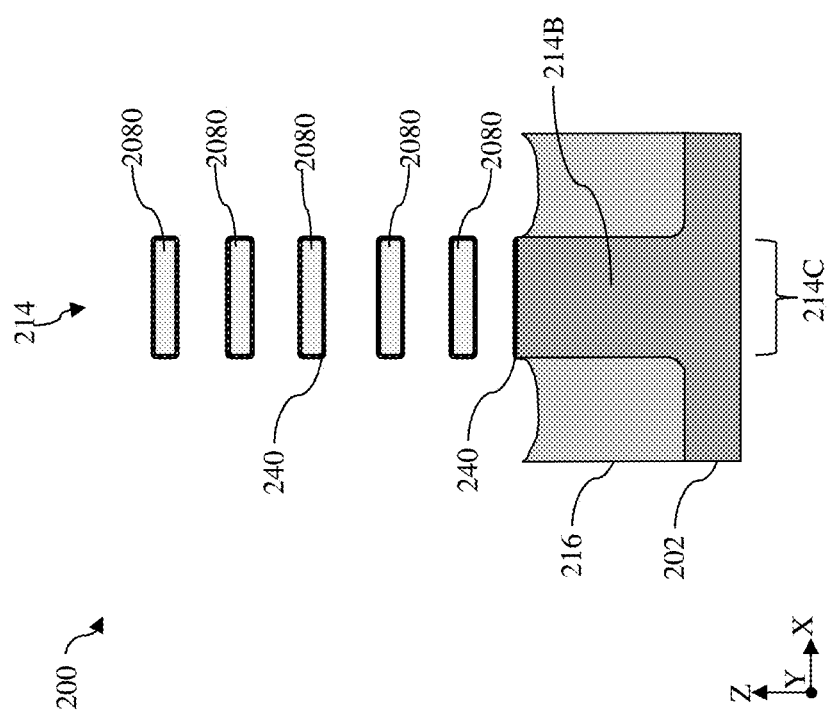

Referring to FIGS. 1 and 15, method 100 includes a block 120 where a cladding layer 240 is formed on the channel members 2080. In some embodiments, the cladding layer 240 may include germanium (Ge) and may be deposited using CVD, ALD, or epitaxy. An example CVD process for forming the cladding layer 240 may include precursors such as germane (GeH$_4$) or digermane (Ge$_2$H$_6$). An example ALD process for forming the cladding layer 240 may include precursors such as dimethyl germanium dichloride (GeH$_2$Cl$_2$) and hydrogen (H$_2$). Example epitaxy processes may include VPE, UHV-CVD, and MBE. In some other embodiments, the cladding layer 240 may include not only germanium but also silicon. Similarly, such silicon germanium cladding layer 240 may be deposited using CVD, ALD or epitaxy. Deposition of such silicon germanium cladding layer 240 may include use both germanium-containing precursors and silicon-containing precursors. Example germanium-containing precursors may include germane ($GeH_4$), digermane ($Ge_2H_6$), or dimethyl germanium dichloride ($GeH_2Cl_2$). Example silicon-containing precursors may include silane ($SiH_4$), disilane ($Si_2H_6$), or chlorosilane ($SiHCl_3$), or dimethyl silicon dichloride ($SiH_2Cl_2$). As shown in FIG. 15, due to lattice mismatch, the formation of the cladding layer 240 may be selective to the substrate 202 and the channel members 2080. That is, the cladding layer 240 may be substantially absent from surfaces of the isolation feature 216. In some implementations, the cladding layer 240 may be formed to a thickness between about 0.5 Angstrom (Å) and about 5 Å.

Figure 16:
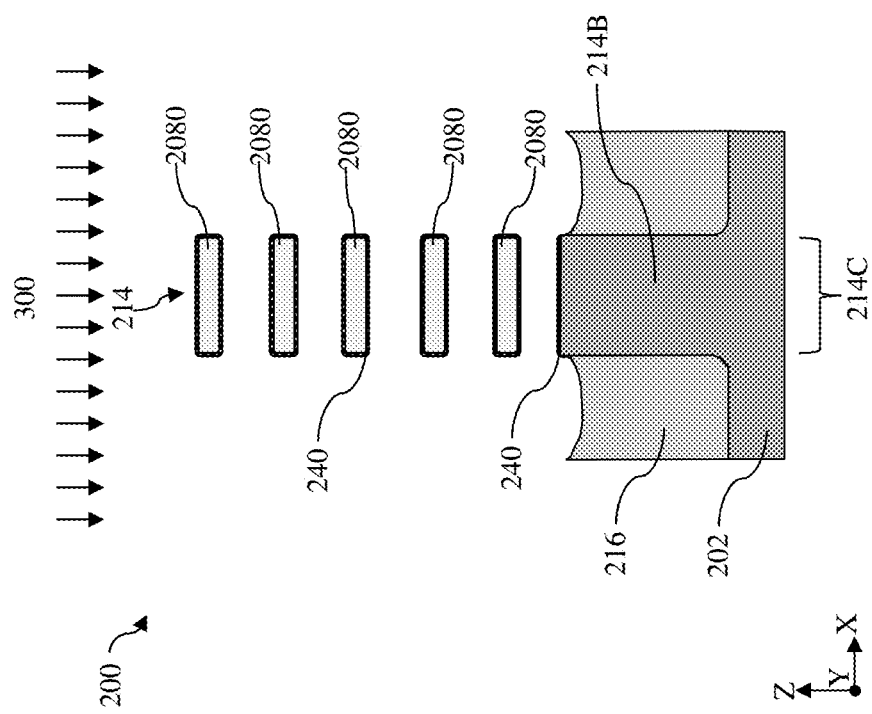

Referring to FIGS. 1 and 16, method 100 includes a block 122 where a first anneal process 300 is performed. The first anneal process 300 may be a rapid thermal anneal (RTA) process, a laser spike anneal process, or a flash anneal process. The first anneal process 300 functions to cause germanium in the cladding layer 240 to diffuse into the silicon (Si) lattice of the channel members 2080 or to cause inter-diffusion between silicon (Si) in the channel members 2080 and germanium (Ge) in the cladding layer 240. The inter-diffusion of silicon and germanium may cause alloying of silicon and germanium, thereby forming silicon germanium. The first anneal process 300 therefore may also be referred to as a germanium drive-in process. It is noted that the first anneal process 300 may be in-situ with the formation of the cladding layer 240 or may be ex-situ after the formation of the cladding layer 240. In the former, the formation of the cladding layer 240 and the first anneal process 300 take place in the same process chamber without the need to break vacuum. In some implementation, the first anneal process 300 may even be alternating with the formation of the cladding layer 240 and such alternating cycles gradually pumps germanium into the channel members 2080. In the latter, the first anneal process 300 and the formation of the cladding layer 240 may take place in the same process chamber or in two different process chambers.

In some implementations, the first anneal process 300 may include a first anneal temperature between about 600° C. and about 950° C. When the first anneal temperature is below 600° C. and the diffusion of germanium may be insignificant. Here, the first anneal temperature may refer to the peak temperature of the first anneal process 300. The first anneal process 300 may result in a germanium concentration gradient from the surface of the cladding layer 240 into the channel members 2080. Put differently, a germanium concentration is at its highest on the surface of the cladding layer 240 and gradually decreases with depth. Because the germanium concentration is generally inversely related the rate of etching in etchants or cleaning solutions, the surface portion of the cladding layer 240, with higher germanium concentration, is more susceptible to etching and cleaning. In some instances wherein the cladding layer 240 is formed of germanium, the outermost portion of the cladding layer 240 may remain substantially silicon-free after the first anneal process 300. The germanium concentration gradient may vary with the length of duration and anneal temperature of the first anneal process 300. When the anneal temperature is low or the anneal duration is short, the germanium concentration gradient may be steep and less germanium is allowed to diffuse into the channel members 2080. When the anneal temperature is high or the anneal duration is long, the germanium concentration gradient may be flatter and more germanium is allowed to diffuse deeper into the channel members 2080. Without the first anneal process 300 to drive in germanium, the cladding layer 240 may be substantially, if not completely, in the subsequent cleaning process.

Figure 17:
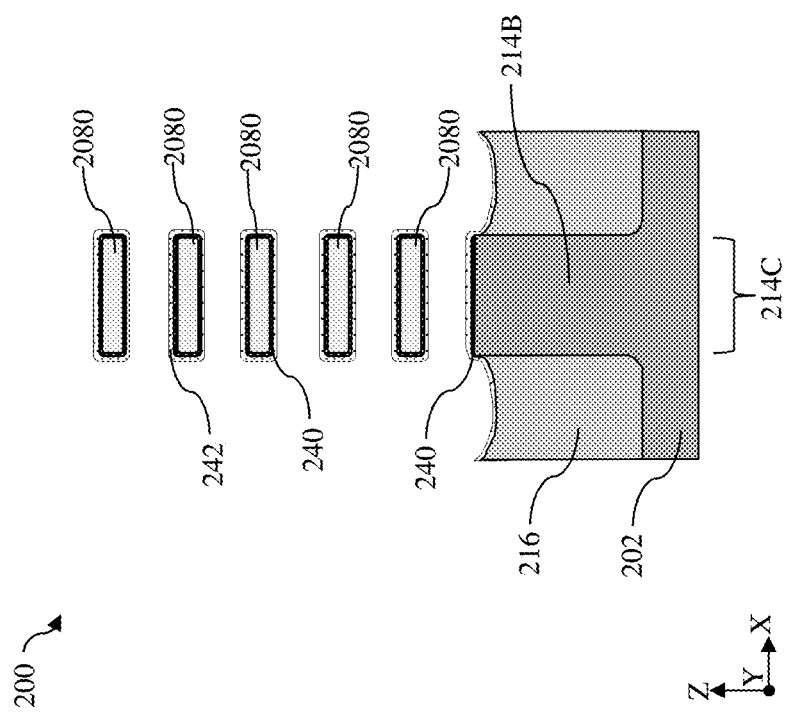

Referring to FIGS. 1, 17, 18, 19, and 20, method 100 includes a block 124 where a gate structure 250 is formed over and around the channel members 2080. In the depicted embodiment, the gate structure 250 is deposited into the gate trench 238 (shown in FIG. 12) and includes an interfacial layer 242, a gate dielectric layer 244, and a gate electrode layer 246. In some embodiments, the channel members 2080, along with the cladding layer 240 deposited thereon, may be subject to a pre-clean process that may include use of RCA SC-1 (ammonia, hydrogen peroxide and water) and/or RCA SC-2 (hydrochloric acid, hydrogen peroxide and water). The pre-clean process forms an interfacial layer 242 out of the cladding layer 240, as shown in FIG. 17. As described above, the first anneal process 300 may have converted the cladding layer 240 into a single silicon germanium (SiGe) layer or an inner silicon germanium (SiGe) layer and an outer germanium (Ge) layer. It is observed that pure germanium layers or germanium-rich silicon germanium layers may be removed during the pre-clean process. The oxidizing agents in the pre-clean process may oxidize the silicon-rich silicon germanium layer to form the interfacial layer 242, which may therefore include germanium oxide, silicon germanium oxide, or germanium-doped silicon oxide. Because of the removal of the germanium-rich layers in the cladding layer 240, a silicon content in the interfacial layer 242 may be greater than a germanium content in the interfacial layer 242.

Figure 18:
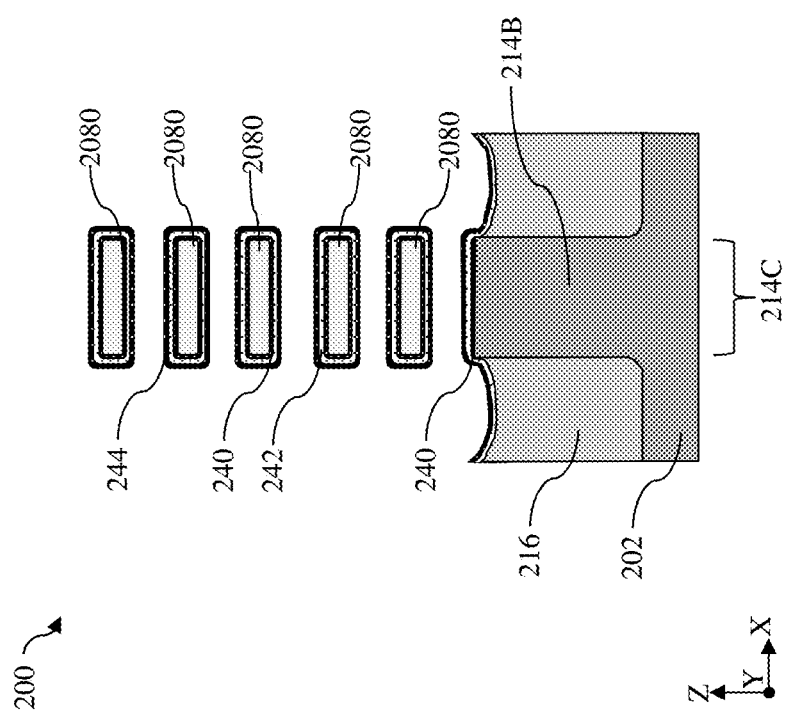
Figure 19:
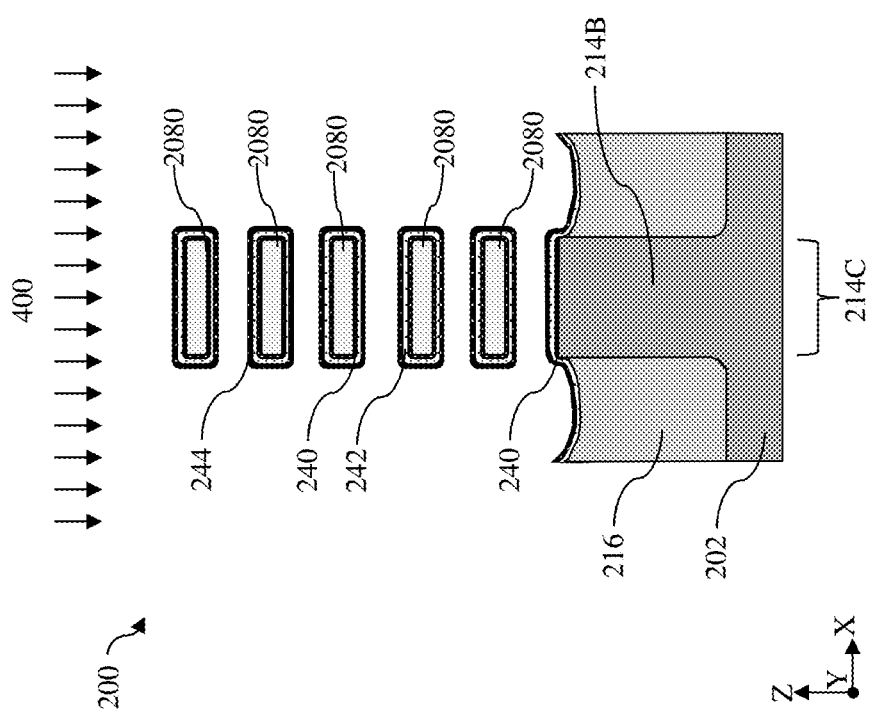

Referring to FIG. 18, a gate dielectric layer 244 may be deposited over the interfacial layer 242 using ALD, physical vapor deposition (PVD), CVD, oxidation, and/or other suitable methods. The gate dielectric layer 244 may be formed of high-K dielectric materials. As used and described herein, high-k dielectric materials include dielectric materials having a high dielectric constant, for example, greater than that of thermal silicon oxide (~3.9). The gate dielectric layer 244 may include hafnium oxide. Alternatively, the gate dielectric layer 244 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. As shown in FIG. 19, operations at block 124 may include a second anneal process 400. The second anneal process 400 may be a rapid thermal anneal (RTA) process, a laser spike anneal process, or a flash anneal process and may include an anneal temperature between about 700° C. and about 1000° C. The second anneal process 400 functions to remove defects and charge carrier traps at the interface of the gate dielectric layer 244 and the interfacial layer 242. In some instances, the second anneal process 400 may form hafnium silicate at the interface between the gate dielectric layer 244 and the interfacial layer 242.

Figure 20:
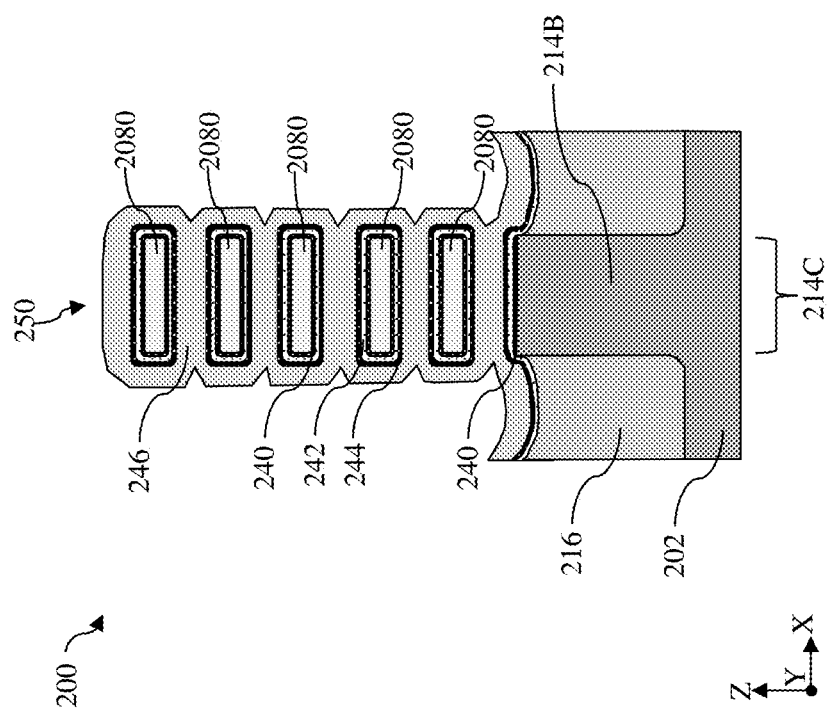

Referring to FIG. 20, the gate electrode layer 246 is then deposited over the gate dielectric layer 244 using ALD, PVD, CVD, e-beam evaporation, or other suitable methods. The gate electrode layer 246 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 246 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different gate electrode layers may be formed separately for n-type transistors and p-type transistors, which may include different metal layers (e.g., for providing different n-type and p-type work function metal layers).

At block 124, the gate structure 250 (including the interfacial layer 242, the gate dielectric layer 244, and the gate electrode layer 246) is formed within the gate trench 238 (shown in FIG. 12) over the workpiece 200 and is deposited to wrap each of the channel members 2080. In this regard, the gate structure 250 wraps around each of the channel members 2080 on the X-Z plane.

Figure 21:
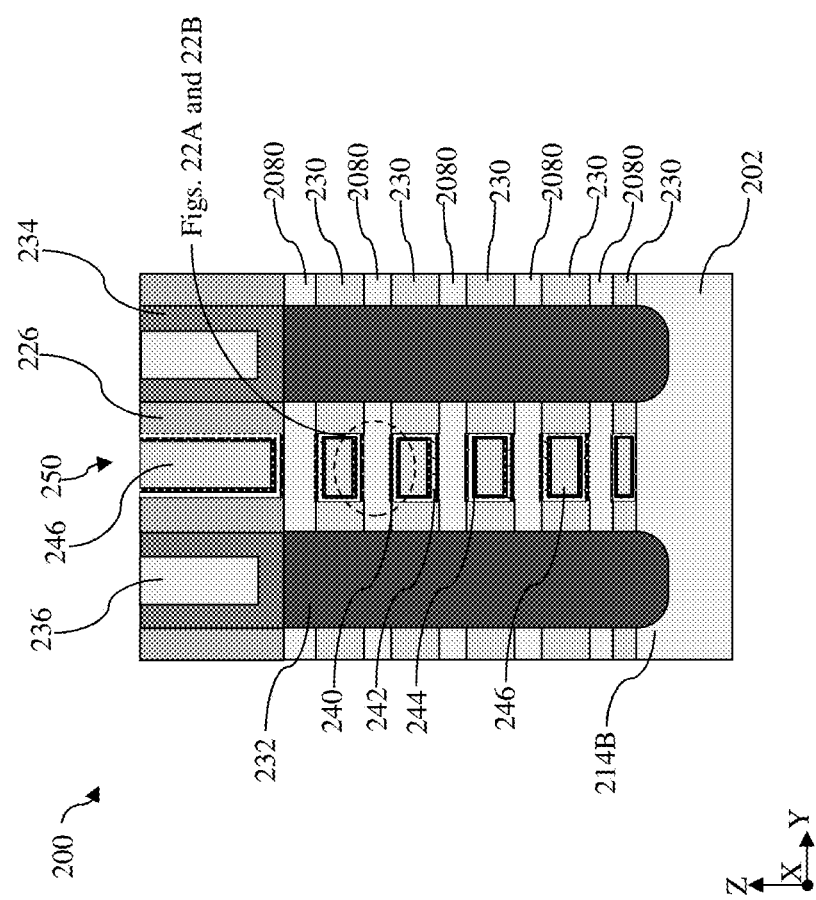

Referring to FIGS. 1 and 21, method 100 includes a block 126 where further processes are performed. Such further processes may include planarization of the workpiece 200, formation of source/drain contacts, formation of gate contacts, formation of backside source/drain contact, and formation of interconnect structures. FIG. 21 illustrates the workpiece 200 after a planarization process, such as a CMP process. The planarization process may be performed to remove excessive materials for both the gate dielectric layer 244 and the gate electrode layer 246, and thereby provide a substantially planar top surface of the gate structure 250.

Figure 22A:
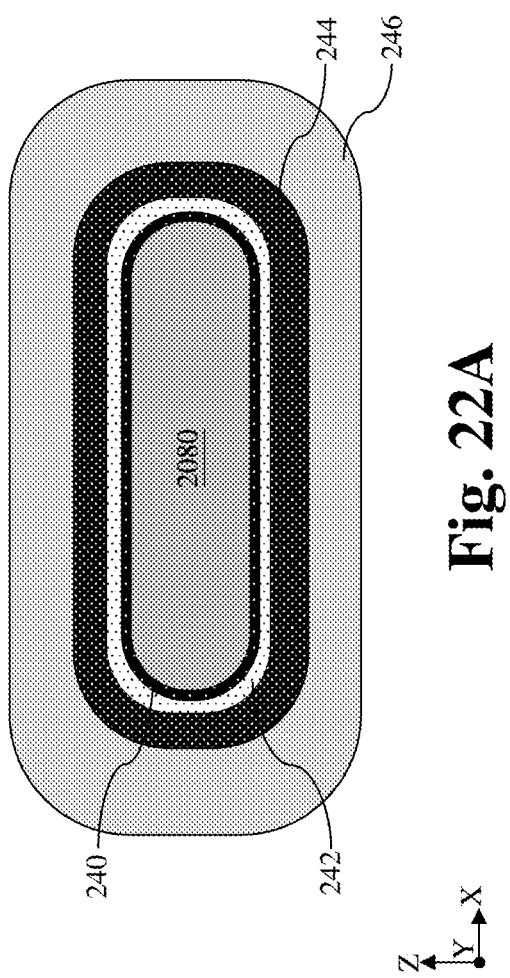
FIGS. 22A and 22B illustrate enlarged cross-sectional views of a nanostructure wrapped around by a gate structure, according to one or more aspects of the present disclosure.
Figure 22B:
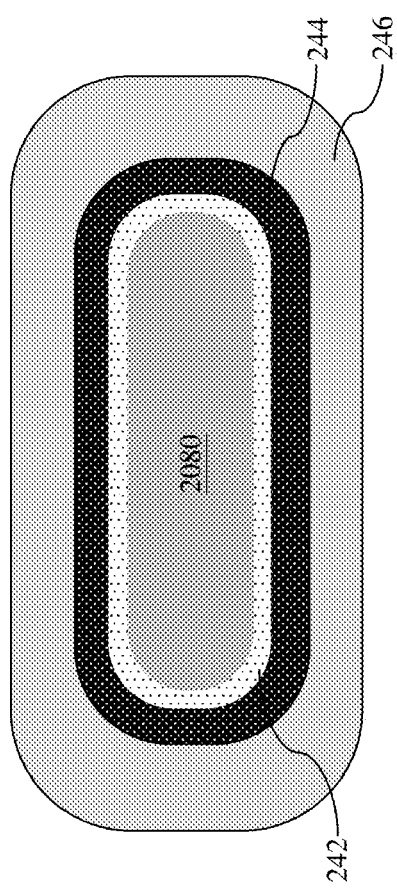

To illustrate the construction of the gate structure 250 after operations of method 100, the dotted area around one of the channel members 2080 in FIG. 21 is enlarged and illustrated in the fragmentary cross-sectional view in FIG. 22A or 22B. Rather than being a cross-sectional view along the X direction, the fragmentary cross-sectional views in FIGS. 22A and 22B are along the Y direction. As described above, after the first anneal process 300, the cladding layer 240 may be converted or alloyed into a silicon germanium layer or a silicon germanium layer lined by a germanium layer. At the same time, a germanium concentration gradient along the depth of the cladding layer 240 may be created. The pre-clean at block 124 may remove the germanium-rich outer portion of the converted cladding layer 240 and oxidize the silicon rich inner portion of the converted cladding layer 240. Depending on how deep germanium travels into the channel members 2080, a portion of the cladding layer 240 may remain.

Referring first to FIG. 22A, when not all of the converted cladding layer 240 is oxidized to form the interfacial layer 242, a portion of the cladding layer 240 may remain disposed on the channel member 2080. In these embodiments, the converted cladding layer 240 wraps around the channel member 2080, the interfacial layer 242 is disposed on the remaining cladding layer 240, the gate dielectric layer 244 is disposed on the interfacial layer 242, and the gate electrode layer 246 is disposed on the gate dielectric layer 244.

In some instances, the germanium concentration in the cladding layer 240 and the interfacial layer 242 may be between about 1% and about 10%, such as between about 3% and about 4%. It is noted that when the portion of the cladding layer 240 with a germanium concentration greater than about 10% is likely to be removed. In these embodiments, the cladding layer 240 may include silicon germanium and the interfacial layer 242 may include germanium oxide, silicon germanium oxide, or germanium-doped silicon oxide. Because the interfacial layer 242 includes germanium, the interfacial layer 242 may be referred to a germanium-containing oxide layer.

Referring first to FIG. 22B, when all of the converted cladding layer 240 is oxidized to form the interfacial layer 242, substantially all of the cladding layer 240 may be removed from the channel member 2080. In these embodiments, the interfacial layer 242 wraps around the channel member 2080, the gate dielectric layer 244 wraps around the interfacial layer 242, and the gate electrode layer 246 wraps around the gate dielectric layer 244. In some instances, the germanium concentration in the interfacial layer 242 may be between about 1% and about 10%, such as between about 3% and about 4%. It is noted that when the portion of the cladding layer 240 with a germanium concentration greater than about 10% is likely to be removed during the pre-clean process. In these embodiments, the interfacial layer 242 may include silicon oxide, germanium oxide, silicon germanium oxide, or germanium-doped silicon oxide. Because the interfacial layer 242 includes germanium, the interfacial layer 242 may be referred to a germanium-containing oxide layer.

Figure 23:
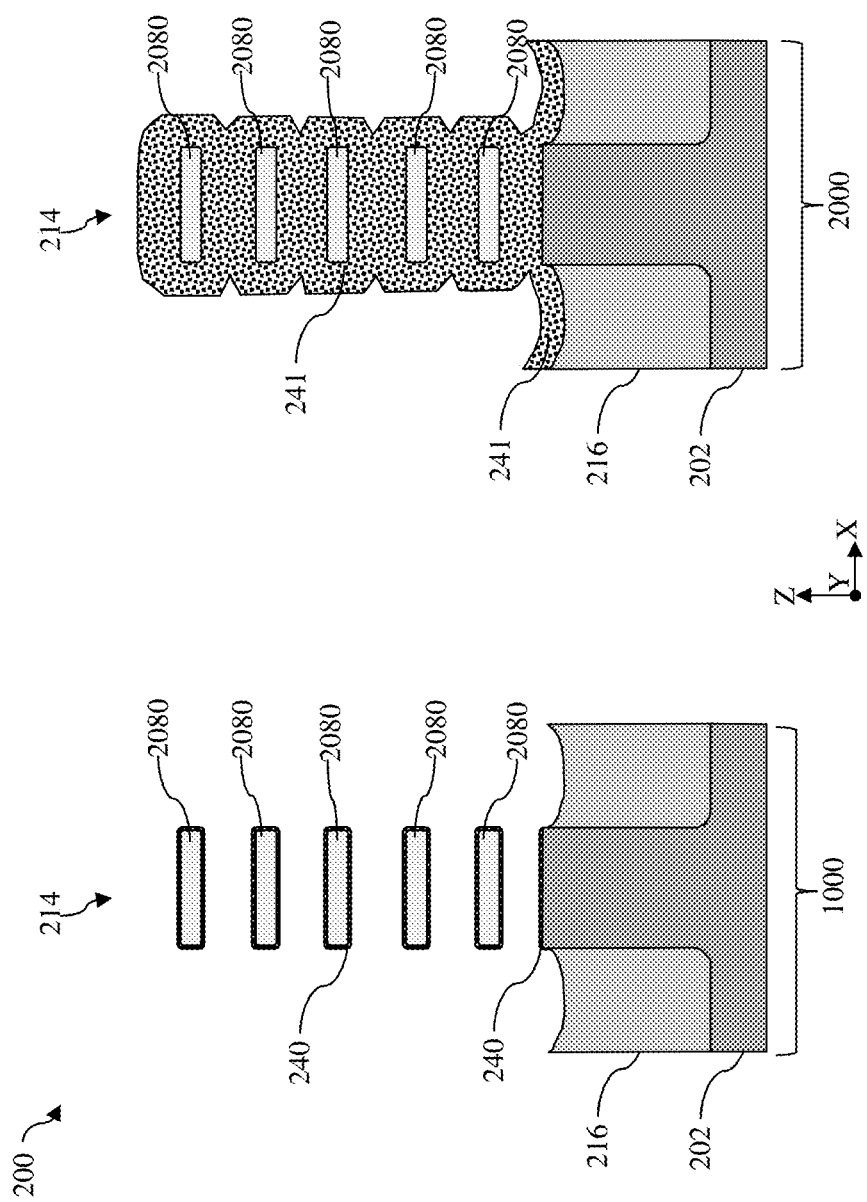
FIGS. 23 and 24 illustrate example embodiments where a germanium cladding layer is selectively implemented in one of the device regions, according to one or more aspects of the present disclosure.

In some embodiments illustrated in FIG. 23, the cladding layer 240 is selectively implemented to p-type MBC transistors and is not implemented to n-type MBC transistors. Reference is first made to FIG. 23. FIG. 23 illustrates a workpiece 200 that includes a p-type device region 1000 and an n-type device region 2000. Although not explicitly shown, the substrate 202 in the p-type device region 1000 may include an n-type well and the substrate 202 in the n-type device region 2000 may include a p-type well. To carry out selective implementation of the cladding layer 240 using method 100, a mask layer 241 may be formed in the n-type device region 2000 to mask the channel members 2080 in the n-type device region 2000. In some embodiments, the masking layer 241 may be a photoresist layer or a bottom antireflective coating (BARC) layer. In some instances, the BARC layer may include silicon oxynitride, silicon oxide, a polymer, or a combination thereof and may be deposited using CVD or ALD. With the n-type device region 2000 covered by the masking layer 241, the cladding layer 240 may be selectively deposited on the substrate 202 and the channel members 2080 in the p-type device region 1000.

Figure 24:
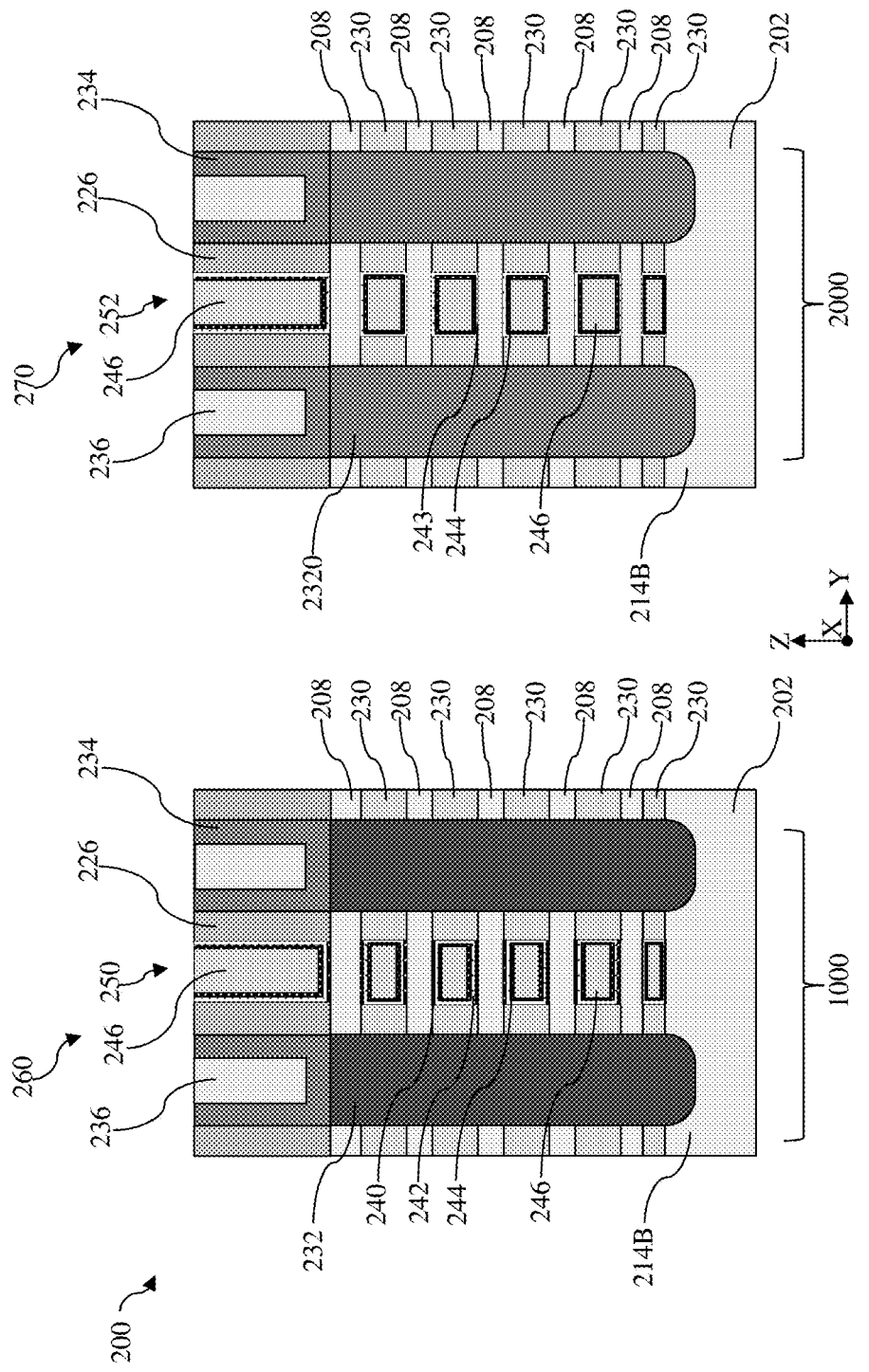

With the use of method 100 and the process alteration shown in FIG. 23, a p-type transistor 260 may be formed in the p-type device region 1000 and an n-type transistor 270 may be formed in the n-type device region 2000, as illustrated in FIG. 24. Both the p-type transistor 260 and the n-type transistor 270 are MBC transistors that each include a stack of channel members 2080 in the channel region. The p-type transistor 260 includes the p-type source/drain features 232 and the gate structure 250 wrapping around each of the channel members 2080. The n-type transistor 270 includes n-type source/drain features 2320 and a germanium-free gate structure 252 wrapping around each of the channel members 2080. As described above, the p-type source/drain features 232 may include silicon germanium (SiGe) doped with a p-type dopant, such as boron (B) and the n-type source/drain features 2320 may include silicon (Si) doped with an n-type dopant, such as phosphorus (P) or arsenic (As). Formation of the p-type source/drain feature 232 and the n-type source/drain features 2320 is omitted for brevity. As illustrated in FIGS. 22A and 22B, the gate structure 250 may include germanium-containing interfacial layer 242 and may even include a leftover portion of the cladding layer 240. Due to the lack the cladding layer 240 during its formation process, germanium is absent from the germanium-free gate structure 252 and the germanium-free gate structure 252 includes a germanium-free interfacial layer 243, which consists essentially of silicon oxide. Experiments have demonstrated that the implementation of the cladding layer 240 or the formation of the germanium-containing interfacial layer 242 in the p-type device region 1000 may create a shift of work function between about 100 mV and about 250 mV, which results in lowering the threshold voltage of the p-type transistor 260. It is theorized that the shift of work function originates from dipole or fixed charge formation at or around the germanium-containing interfacial layer 242.

Although not intended to be limiting, one or more embodiments of the present disclosure provide many benefits to a semiconductor device or the formation thereof. For example, the present disclosure provides an embodiment that include a p-type MBC transistor in a p-type device area and an n-type MBC transistor in an n-type device area. Both the p-type MBC transistor and the n-type MBC transistor include silicon channel members. To provide desirable threshold voltages for the p-type MBC transistor and the n-type MBC transistor, a germanium-containing cladding layer is selectively deposited over the silicon channel members in the p-type device region while the n-type device region is masked off. The germanium in the cladding layer is driven-in by an anneal process and the cladding layer is at least partially converted to a germanium containing interfacial layer. Without the cladding layer, a germanium-free interfacial layer is deposited in the n-type device region. The germanium-containing interfacial layer creates dipoles or fixed charges to lower the threshold voltage of the p-type MBC transistor.

In one exemplary aspect, the present disclosure is directed to a semiconductor structure. The semiconductor structure includes a fin structure over a substrate, a vertical stack of silicon nanostructures disposed over the fin structure, an isolation structure disposed around the fin structure, a germanium-containing interfacial layer wrapping around each of the vertical stack of silicon nanostructures, a gate dielectric layer wrapping around the germanium-containing interfacial layer, and a gate electrode layer wrapping around the gate dielectric layer.

In some embodiments, the semiconductor structure may further include a silicon germanium layer between the germanium-containing interfacial layer and each of the vertical stack of silicon nanostructures. In some embodiments, the germanium-containing interfacial layer includes silicon germanium oxide, germanium oxide, or germanium-doped silicon oxide. In some implementations, the germanium-containing interfacial layer is disposed on the fin structure. In some instances, the semiconductor structure may further include a silicon germanium layer between the germanium-containing interfacial layer and the fin structure. In some instances, the semiconductor structure may further include inner spacer features interleaving the vertical stack of silicon nanostructures. The germanium-containing interfacial layer is in contact with the inner spacer features.

In another exemplary aspect, the present disclosure is directed to a semiconductor device. The semiconductor device includes a p-type transistor and an n-type transistor. The p-type transistor includes a first fin structure over a substrate, a first plurality of silicon nanostructures disposed over the first fin structure, a first interfacial layer wrapping around each of the first plurality of silicon nanostructures, a gate dielectric layer wrapping around the first interfacial layer, and a gate electrode layer wrapping around the gate dielectric layer. The n-type transistor includes a second fin structure over the substrate, a second plurality of silicon nanostructures disposed over the second fin structure, a second interfacial layer wrapping around and in contact with each of the second plurality of silicon nano structures, the gate dielectric layer wrapping around the second interfacial layer, and the gate electrode layer wrapping around the gate dielectric layer. A composition of the first interfacial layer is different from a composition of the second interfacial layer.

In some embodiments, the first interfacial layer includes germanium and the second interfacial layer is free of germanium. In some embodiments, the semiconductor device may further include a silicon germanium layer between the first interfacial layer and the first plurality of silicon nanostructures. In some implementations, the first interfacial layer is disposed on the first fin structure. In some instances, the first plurality of silicon nanostructures consist essentially of silicon. In some embodiments, the first interfacial layer includes silicon germanium oxide, germanium oxide, or germanium-doped silicon oxide and the second interfacial layer includes silicon oxide. In some embodiments, the semiconductor device may further include inner spacer features interleaving the first plurality of silicon nanostructures. The first interfacial layer is in contact with the inner spacer features. In some instances, the p-type transistor further includes a p-type source/drain feature coupled to the first plurality of silicon nano structures. The p-type source/drain feature includes silicon germanium and a p-type dopant. The n-type transistor further includes a n-type source/drain feature coupled to the second plurality of silicon nanostructures and the n-type source/drain feature includes silicon and an n-type dopant.

In yet another exemplary aspect, the present disclosure is directed to a method. The method includes alternately stacking first epitaxy layers and second epitaxy layers to form a semiconductor stack over a substrate, patterning the semiconductor stack to form a fin, removing the first epitaxy layers of the fin to form nanostructures from the second epitaxy layers, forming a germanium-containing cladding layer wrapping around the nanostructures, performing a pre-clean process to convert at least a portion of the germanium-containing cladding layer into a germanium-containing interfacial layer, depositing a gate dielectric layer wrapping around the germanium-containing interfacial layer, and forming a gate electrode layer over the gate dielectric layer.

In some embodiments, the first epitaxy layers consist essentially of silicon germanium and the second epitaxy layers consist essentially of silicon. In some embodiments, the forming of the germanium-containing cladding layer includes depositing the germanium-containing cladding layer on the substrate and the nanostructure by chemical vapor deposition (CVD), atomic layer deposition (ALD), or epitaxy. In some implementations, the method may further include after the forming of the germanium-containing cladding layer and before the pre-clean process, performing a first anneal process. In some instances, the pre-clean process includes use of ammonia hydroxide, hydrogen peroxide, water, or hydrochloric acid. In some embodiments, the method may further include after the depositing of the gate dielectric layer and before the forming of the gate electrode layer, performing a second anneal process.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   alternately stacking first epitaxy layers and second epitaxy layers to form a semiconductor stack over a substrate;
   patterning the semiconductor stack to form a fin;
   removing the first epitaxy layers of the fin to form nano structures from the second epitaxy layers;
   forming a germanium-containing cladding layer wrapping around the nanostructures;
   performing a pre-clean process to convert at least a portion of the germanium-containing cladding layer into a germanium-containing interfacial layer;
   depositing a gate dielectric layer wrapping around the germanium-containing interfacial layer; and
   forming a gate electrode layer over the gate dielectric layer.

2. The method as claimed in claim 1, wherein the first epitaxy layers consist essentially of silicon germanium and the second epitaxy layers consist essentially of silicon.

3. The method as claimed in claim 1, wherein the forming of the germanium-containing cladding layer comprises depositing the germanium-containing cladding layer on the substrate and the nanostructures by chemical vapor deposition (CVD), atomic layer deposition (ALD), or epitaxy.

4. The method as claimed in claim 1, further comprising:
   after the forming of the germanium-containing cladding layer and before the pre-clean process, performing a first anneal process.

5. The method as claimed in claim 4, wherein the first anneal process comprises a first anneal temperature between about 600° C. and about 950° C.

6. The method as claimed in claim 1,
   wherein the pre-clean process comprises use of ammonia hydroxide, hydrogen peroxide, water, or hydrochloric acid.

7. The method as claimed in claim 1, further comprising:
   after the depositing of the gate dielectric layer and before the forming of the gate electrode layer, performing a second anneal process.

8. The method as claimed in claim 7, wherein the second anneal process comprises a second anneal temperature between about 700° C. and about 1000° C.

9. The method as claimed in claim 1, wherein the germanium-containing cladding layer comprises a thickness between about 0.5 Å and about 5 Å.

10. A method, comprising:
    receiving a workpiece comprising a stack disposed over a semiconductor substrate, the stack comprising a plurality of first semiconductor layers interleaved by a plurality of second semiconductor layers;
    patterning the stack and a portion of the semiconductor substrate to form a fin-shaped structure that includes a base portion formed from the semiconductor substrate and a top portion formed from the stack;
    forming an isolation feature around the base portion of the fin-shaped structure;
    forming a dummy gate stack over a channel region of the fin-shaped structure;
    recessing a source/drain region of the fin-shaped structure;
    forming a source/drain feature over the recessed source/drain region;
    removing the dummy gate stack;
    selectively removing the plurality of second semiconductor layers in the channel region to release the plurality of first semiconductor layers in the channel region as channel members;
    depositing a germanium-containing cladding layer to wrap around each of the channel members;
    performing a first anneal process to cause interdiffusion between the germanium-containing cladding layer with the channel members;
    performing a pre-clean process to convert at least a portion of the germanium-containing cladding layer into a germanium-containing interfacial layer;
    depositing a gate dielectric layer wrapping around the germanium-containing interfacial layer; and
    forming a gate electrode layer over the gate dielectric layer.

11. The method of claim 10, wherein the depositing of the germanium-containing cladding layer comprises a chemical vapor deposition (CVD) process using germane ($GeH_4$) or digermane ($Ge_2H_6$).

12. The method of claim 10, wherein the depositing of the germanium-containing cladding layer comprises an atomic layer deposition (ALD) process using dimethyl germanium dichloride ($GeH_2Cl_2$) and hydrogen ($H_2$).

13. The method of claim 10, wherein the first anneal process comprises a rapid thermal anneal (RTA) process, a laser spike anneal process, or a flash anneal process.

14. The method of claim 10, further comprising:
    after the depositing of the gate dielectric layer and before the forming of the gate electrode layer, performing a second anneal process.

15. The method of claim 10, wherein the depositing of the germanium-containing cladding layer is selective to surfaces of the semiconductor substrate and the channel members such that the germanium-containing cladding layer is substantially absent from surfaces of the isolation feature.

16. A method, comprising:
    receiving a workpiece comprising a stack disposed over a semiconductor substrate, the stack comprising a plurality of first semiconductor layers interleaved by a plurality of second semiconductor layers;
    patterning the stack and a portion of the semiconductor substrate to form a fin-shaped structure that includes a base portion formed from the semiconductor substrate and a top portion formed from the stack;
    forming an isolation feature around the base portion of the fin-shaped structure;
    forming a dummy gate stack over a channel region of the fin-shaped structure;
    recessing a source/drain region of the fin-shaped structure to expose sidewalls of the plurality of first semiconductor layers and the plurality of second semiconductor layers in the channel region;

selectively and partially recessing the exposed sidewalls of the plurality of second semiconductor layers to form inner spacer recesses;

depositing inner spacer features in the inner spacer recesses;

removing the dummy gate stack;

selectively removing the plurality of second semiconductor layers in the channel region to release the plurality of first semiconductor layers in the channel region as channel members;

depositing a germanium-containing cladding layer to wrap around each of the channel members;

performing a pre-clean process to convert at least a portion of the germanium-containing cladding layer into a germanium-containing interfacial layer;

depositing a gate dielectric layer wrapping around the germanium-containing interfacial layer; and forming a gate electrode layer over the gate dielectric layer, wherein the depositing of the germanium-containing cladding layer is selective to surfaces of the semiconductor substrate and the channel members such that the germanium-containing cladding layer is substantially absent from surfaces of the isolation feature and surfaces of the inner spacer features.

17. The method as claimed in claim 16, wherein the plurality of first semiconductor layers consist essentially of silicon (Si) and the plurality of second semiconductor layers consist essentially of silicon germanium (SiGe).

18. The method as claimed in claim 16, wherein the depositing of the germanium-containing cladding layer comprises depositing the germanium-containing cladding layer on a top surfaces of the base portion and surfaces of the channel members by chemical vapor deposition (CVD), atomic layer deposition (ALD), or epitaxy.

19. The method as claimed in claim 16, further comprising:

after the forming of the germanium-containing cladding layer and before the pre-clean process, performing a first anneal process.

20. The method as claimed in claim 16, further comprising:

after the depositing of the gate dielectric layer, performing a second anneal process.

* * * * *